United States Patent
Bluen

(10) Patent No.: US 8,402,951 B2
(45) Date of Patent: Mar. 26, 2013

(54) REVERSE OPERATING NONLINEAR SPRING

(75) Inventor: Jeffrey Bluen, Studio City, CA (US)

(73) Assignee: Transonic Combustion, Inc., Camarillo, CA (US)

( * ) Notice: Subject to any disclaimer, the term of this patent is extended or adjusted under 35 U.S.C. 154(b) by 350 days.

(21) Appl. No.: 12/721,499

(22) Filed: Mar. 10, 2010

(65) Prior Publication Data

US 2010/0229833 A1 Sep. 16, 2010

Related U.S. Application Data

(60) Provisional application No. 61/159,044, filed on Mar. 10, 2009.

(51) Int. Cl.
*F02M 37/08* (2006.01)
*F02M 37/00* (2006.01)

(52) U.S. Cl. ........................................ 123/498; 123/490

(58) Field of Classification Search .................. 123/472, 123/478, 490, 498; 239/102.2, 585.1; 310/316.03, 310/317, 323.06, 311, 330
See application file for complete search history.

(56) References Cited

U.S. PATENT DOCUMENTS

| 3,995,813 A | 12/1976 | Bart et al. |
| 4,784,102 A | 11/1988 | Igashira et al. |
| 4,844,339 A | 7/1989 | Sayer et al. |
| 4,958,101 A * | 9/1990 | Takahashi et al. ............ 310/328 |
| 5,004,945 A * | 4/1991 | Tomita et al. ................. 310/328 |
| 5,785,251 A | 7/1998 | Wood et al. |
| 6,148,842 A * | 11/2000 | Kappel et al. .................... 137/79 |
| 6,575,138 B2 * | 6/2003 | Welch et al. .................. 123/467 |
| 7,293,550 B2 | 11/2007 | Beardmore |
| 7,307,371 B2 * | 12/2007 | Jensen et al. .................. 310/328 |
| 7,312,557 B2 * | 12/2007 | Rastegar et al. ............. 310/339 |
| 7,492,076 B2 * | 2/2009 | Heim et al. .................... 310/330 |
| 7,546,826 B2 | 6/2009 | Cheiky |
| 2001/0032612 A1 * | 10/2001 | Welch et al. .................. 123/294 |
| 2003/0042325 A1 * | 3/2003 | D'Arrigo .................... 239/102.2 |
| 2005/0017096 A1 * | 1/2005 | Bachmaier et al. ........... 239/584 |
| 2005/0126551 A1 | 6/2005 | Mello et al. |
| 2009/0255508 A1 | 10/2009 | Cheiky |
| 2010/0017099 A1 | 1/2010 | Becker |
| 2010/0126471 A1 | 5/2010 | Cheiky |
| 2010/0176686 A1 | 7/2010 | Diamond |
| 2010/0180866 A1 | 7/2010 | Becker |
| 2010/0194238 A1 | 8/2010 | Frick |
| 2010/0201290 A1 | 8/2010 | Becker |
| 2010/0201291 A1 | 8/2010 | Cheiky |
| 2010/0204901 A1 | 8/2010 | Cheiky |

* cited by examiner

*Primary Examiner* — Mahmoud Gimie
(74) *Attorney, Agent, or Firm* — W. D. English

(57) ABSTRACT

The present invention provides an apparatus for enabling operation of a piezoelectric actuator, comprising a spring configured to provide a compressive force to a piezoelectric element of a piezoelectric actuator, wherein the compressive force varies with displacement of the piezoelectric element such that the compressive force is less at a first displacement than at a second displacement, and wherein the first displacement is greater than the second displacement.

24 Claims, 6 Drawing Sheets

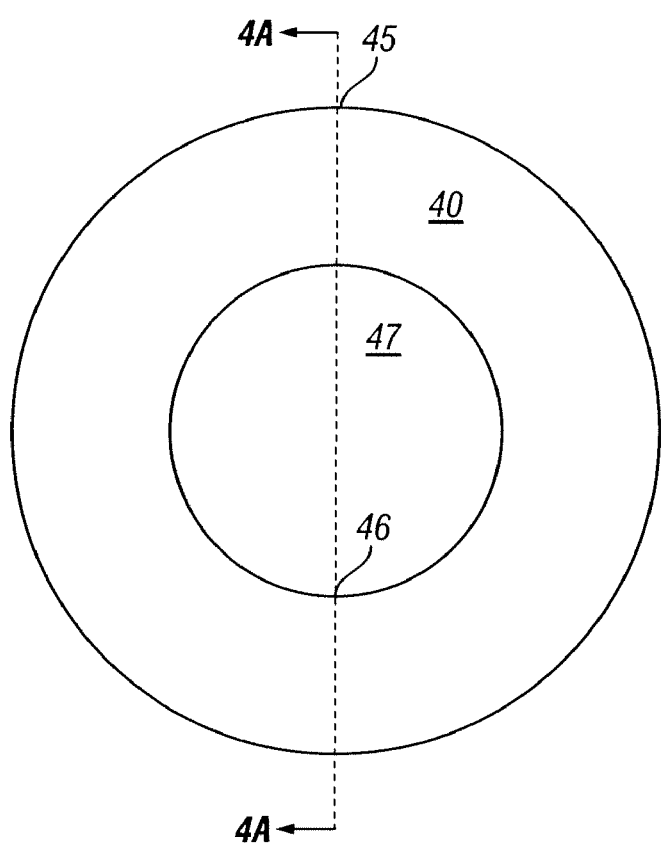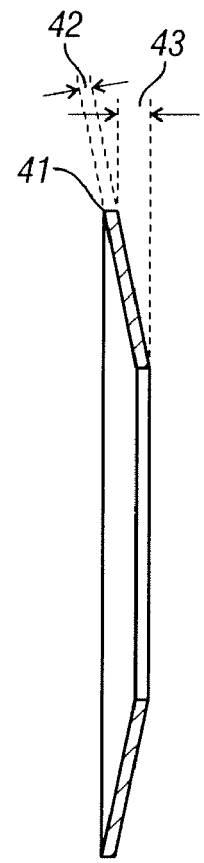
FIG. 4  FIG. 4A

| Bellevilles | Peak Force | Pos | Min Force | Pos | Neg Rate, #/in | Selected Bellevilles |
|---|---|---|---|---|---|---|
| 1 | 9.5 | 0.0125 | 7.4 | 0.024 | 182.609 | 182.609 |
| 2 | 10.7 | 0.013 | 9.7 | 0.023 | -100 | |
| 3 | 9.5 | 0.016 | 4 | 0.029 | -423.077 | -423.077 |
| 4 | 8 | 0.019 | 4.7 | 0.032 | -253.846 | -253.846 |
| 5 | 9.6 | 0.0125 | 4.2 | 0.027 | -372.414 | -372.414 |
| 6 | 9.3 | 0.0125 | 3.5 | 0.026 | -429.63 | -429.63 |
| 7 | 8.5 | 0.014 | 5.3 | 0.025 | -290.909 | -290.909 |
| 8 | 6.4 | 0.012 | 6 | 0.018 | -66.6667 | |
| 9 | 8 | 0.0125 | 3.8 | 0.024 | -365.217 | -365.217 |
| 10 | 8.3 | 0.011 | 2.9 | 0.023 | -450 | -450 |
| | | | | | | -2767.7 |
| | | | | | | -0.48489 |

Total Rate in N/MicroM

FIG. 6

REVERSE OPERATING NONLINEAR SPRING

CROSS REFERENCE TO RELATED APPLICATIONS

This application claims priority from U.S. Provisional Patent Application No. 61/159,044, filed on Mar. 10, 2009, the contents of which are incorporated herein by reference.

TECHNICAL FIELD

The present invention relates to piezoelectric elements, and more particularly, some embodiments relate to piezoelectric element compression springs.

DESCRIPTION OF THE RELATED ART

Piezoelectric actuators comprise a piezoelectric element such as a piezoelectric material (e.g., a crystal, ceramic, or polymer) coupled to electrical contacts to allow a voltage to be applied to the piezoelectric material. Piezoelectric actuators utilize the converse piezoelectric effect to create a mechanical displacement in response to an applied voltage. Such actuators may be used in applications such as machine tools, disk drives, military applications, ink delivery systems for printers, medical devices, precision manufacturing, fuel injection, or any application which requires high precision or high speed fluid delivery.

Typical fuel injectors may have hydraulically, electromagnetically, or piezoelectric actuated injector pins. In a piezoelectric actuated fuel injector, a piezoelectric element is a material that changes dimensions when an electric charge is applied. The piezoelectric element will expand when the charge is present and will contract when the charge is removed. Accordingly, fuel injectors have used piezoelectric-electric material to move an injector pin in a fuel injector from a closed to open position and vice versa. Normally the injector pin is directly attached to the piezoelectric element and is in a closed state when the piezoelectric element is not energized. The actuator closes the injector or extends the injector pin when the piezoelectric element is excited with an electric voltage.

Piezoelectric actuators provide a fast expansion rate and high compressive forces. However, they typically have a small displacement stroke. In applications, such as fuel injectors, where a long displacement stroke is desired, the piezoelectric actuator is typically composed of many layers of piezoelectric material that are bonded together. These piezoelectric actuators are not tolerant of tensile loads during contraction. If the piezoelectric actuator is placed under tension during relaxation, the bonding layer may delaminate, leading to failure of the device.

In many applications, the piezoelectric actuation occurs at a very rapid rate. In these applications, the differences in inertial forces and contraction start times among the piezoelectric layers can cause high tensile loads on the bonding and failure of the device. Accordingly, the piezoelectric material is spring compressed such that tension is not placed on the bonding layers during contraction. However, the compressive force applied by the spring increases as the piezoelectric actuator expands. This increasing compressive force can result in a reduction of the actual stroke length as compared to the actuator's potential stroke length. Typically, the actuator stroke length is increased by reducing the spring constant by using a weaker spring. However, this reintroduces the risk of delamination during relaxation.

BRIEF SUMMARY OF EMBODIMENTS OF THE INVENTION

According to various embodiments of the invention a negative rate spring, having a spring force profile configured such that the compressive force on a piezoelectric actuator decreases as the actuator expands, increases the effective stroke length of a piezoelectric actuator.

According to an embodiment of the invention, a method of operating a piezoelectric actuator comprises providing a compressive force to a piezoelectric element; wherein the compressive force varies with displacement of the piezoelectric element such that the compressive force is less at a first displacement then at a second displacement; and wherein the first displacement is greater than the second displacement.

According to another embodiment of the invention, an apparatus for enabling operation of a piezoelectric actuator comprises a spring configured to provide a compressive force to a piezoelectric element of a piezoelectric actuator; wherein the compressive force varies with displacement of the element such that the compressive force is less at a first displacement then at a second displacement; and wherein the first displacement is greater than the second displacement.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

FIG. 4 illustrates an example negative rate Belleville washer according to an embodiment of the invention.

FIG. 6 illustrates raw data results of a Belleville washer stack test in a piezoelectric fuel injector application according to an embodiment of the invention.

Figure 1B:
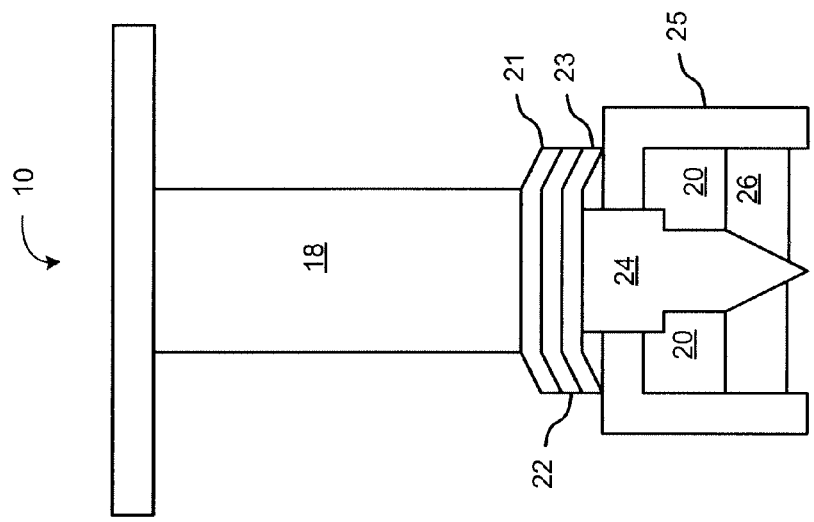
FIG. 1b illustrates the piezoelectric actuated fuel injector in a non-metering state according to an embodiment of the invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward a system and method for providing a compressive force to a piezoelectric actuator that decreases with increasing displacement. A spring having a spring rate profile, a portion of the profile having a negative slope, maybe coupled to, or disposed such that, a piezoelectric actuator's stroke length is increased.

Before describing the invention in detail, it is useful to describe a few example environments with which the invention can be implemented. One such example is that of a piezoelectric actuator for use in a fuel injector. Another example is a piezoelectric actuator for use in an inkjet printer. In particular, the invention may be implemented with a piezoelectric actuator for use in apparatus, methods, and systems of the types described in U.S. Pat. No. 7,444,230, "FUEL INJECTOR HAVING ALGORITHM CONTROLLED LOOK AHEAD TIMING FOR INJECTOR-IGNITION"; U.S. Pat. No. 7,657,363, "FUEL INJECTOR HAVING ALGORITHM CONTROLLED LOOK AHEAD TIMING FOR INJECTOR-IGNITION"; and U.S. patent application Ser. No. 11/692,111, "HEATED CATALYZED FUEL INJECTOR FOR INJECTION IGNITION ENGINES"; the contents of which are hereby incorporated by reference in their entirety. Additionally, the invention may be implemented with a piezoelectric actuator for use in apparatus, methods, and systems of the types described in U.S. patent application Ser. No. 12/503,764, "PIEZO ACTUATED FUEL INJECTOR WITH CATALYTIC SECTION"; U.S. patent application Ser. No. 12/612,440, "DUAL SOLENOID FUEL INJECTOR WITH CATALYTIC ACTIVATOR SECTION"; U.S. patent application Ser. No. 12/686,247, "MULTI-ELEMENT PIEZOELECTRIC ACTUATOR DRIVER"; U.S. patent application Ser. No. 12/652,681, "PIEZOELECTRIC ACTUATOR FAULT RECOVERY SYSTEM AND METHOD"; U.S. patent application Ser. No. 12/652,679, "SERIALLY OPERATING MULTI-ELEMENT PIEZOELECTRIC ACTUATOR DRIVER"; U.S. patent application Ser. No. 12/652,674, "SYSTEM AND METHOD FOR DEFINING PIEZOELECTRIC ACTUATOR WAVEFORM"; and U.S. patent application Ser. No. 12/686,298, "PIEZOELECTRIC ACTUATOR EMPLOYING SWITCH."

From time-to-time, the present invention is described herein in terms of these example environments. Description in terms of these environments is provided to allow the various features and embodiments of the invention to be portrayed in the context of an exemplary application. After reading this description, it will become apparent to one of ordinary skill in the art how the invention can be implemented in different and alternative environments.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this section prevails over the definition that is incorporated herein by reference.

Figure 1A:
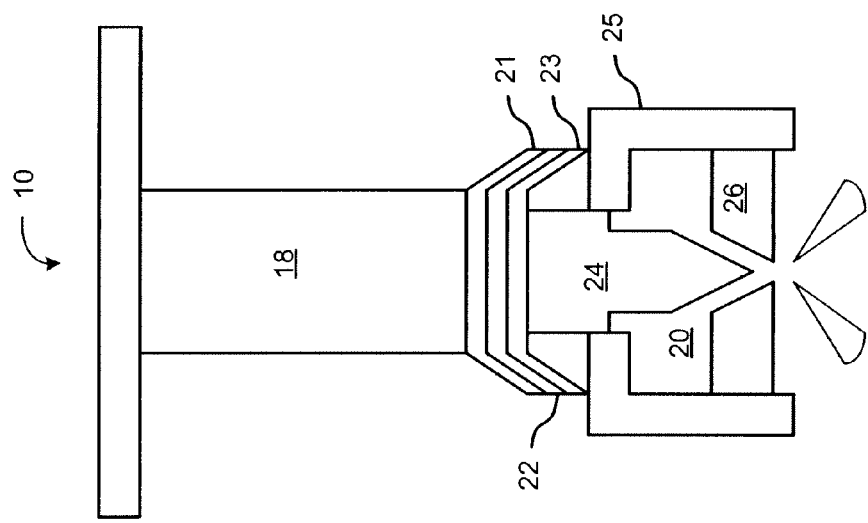
FIG. 1a illustrates an example piezoelectric actuated fuel injector in a fuel metering state according to an embodiment of the invention.

FIG. 1a illustrates an example piezoelectric actuated fuel injector 10 in a fuel metering state according to an embodiment of the invention. In the fuel metering state, no voltage is applied to piezoelectric actuator 18. Accordingly, piezoelectric actuator 18 is at its shortest length. In some embodiments, piezoelectric actuator 18 comprises a plurality of piezoelectric elements or crystals, held together by layers of bonding. During fuel injection, a rapid fuel needle 24 displacement is typically desired. To avoid delamination of the bonding during the contraction phase, a resilient element may be disposed or coupled to the piezoelectric actuator 18 and the housing 25. The resilient element is configured to provide a compressive force such that as the piezoelectric actuator goes from an expanded to a contracted state, it is not placed under tensile load. In the illustrated embodiment, the resilient element comprises a plurality of Belleville washer springs 21, 22, and 23. In other embodiments, the resilient element could comprise other devices such as a coil or hydraulic spring.

FIG. 1b illustrates the piezoelectric actuated fuel injector 10 in a non-metering state according to an embodiment of the invention. In the non-metering state, a voltage is applied across piezoelectric actuator 18 to cause the piezoelectric elements to expand such that nozzle needle 24 blocks injector orifice 26, preventing fuel contained in chamber 20 from escaping. In the expansion phase, Belleville washers 21, 22, and 23 are at their maximum operational compression. In some embodiments, the fuel contained in chamber 20 may be kept under pressure such that the piezoelectric actuator 18 has a bias in the relaxation direction. This pressure may act to hydraulically amplify the compressive force on the actuator 18, further preventing delamination during relaxation.

In such embodiments of the invention, the resilient element may apply a compressive force to the piezoelectric actuator that varies with displacement. For example, in the illustrated embodiment employing Belleville washers 21, 22, 23, the washers may apply a force that lessens as the piezoelectric actuator 18 expands. Accordingly, piezoelectric element 18 may have a longer stroke because the piezoelectric actuator is under less compressive force near the maximum extent of its stroke. Furthermore, the lifetime of such a piezoelectric actuator may be increased with respect to an actuator employing a standard spring because these actuators perform less work than actuators utilizing a standard spring. The reduction in work occurs because the decreasing compressive force results in less total applied force throughout a displacement stroke when compared to an actuator employing a standard spring.

Figure 2B:
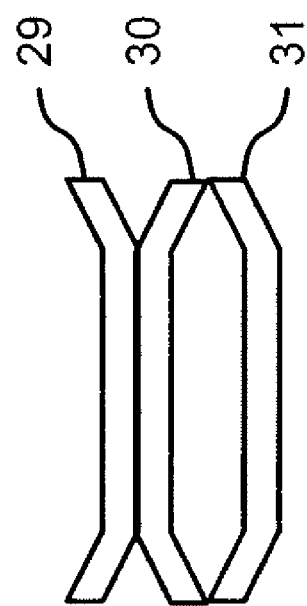
FIG. 2b illustrates a plurality of Belleville washers in series configuration.
Figure 2A:
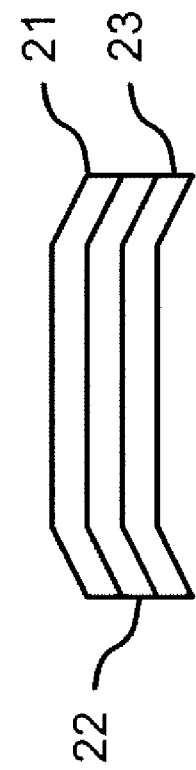
FIG. 2a illustrates a plurality of Belleville washers in parallel configuration.

In further embodiments, the number of compressive springs may vary according to the application or desired performance. When Belleville washers are nested within each other, as illustrated in FIGS. 1a, 1b, and 2a, their spring forces are additive (this configuration is called "parallel"). When Belleville washers 29, 30, and 31 are disposed end to end, as illustrated in FIG. 2b, the inverses of their spring forces, or their "compliances," are additive (this configuration is called "series"). Accordingly, different combinations of Belleville washers in series and parallel may be chosen according to application. For example, a fuel injector may employ as many as ten or more Belleville washers in parallel.

In other embodiments, the compressive force to displacement function may be configured differently according to different applications. For example, in an application employing a piezoelectric actuator for ink metering in an inkjet printer, it may be desirable for the compressive force to increase with displacement for a predetermined portion of the stroke, and then to decrease with displacement for the remainder of the stroke.

Figure 3:
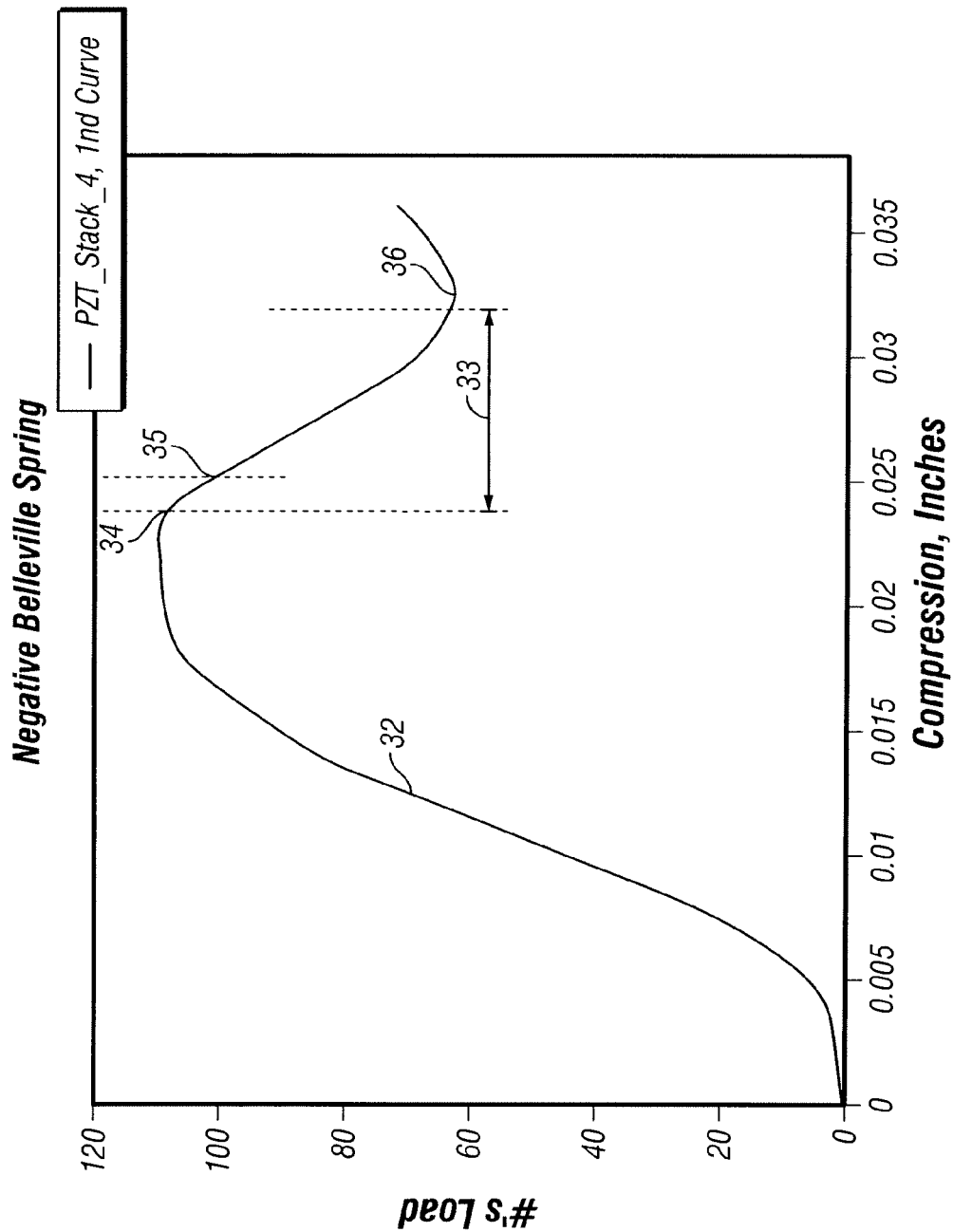
FIG. 3 illustrates a spring force to spring compression profile according to an embodiment of the invention.

FIG. 3 illustrates a spring force to spring compression profile according to an embodiment of the invention. In some embodiments, the spring force compression profile may correspond to the spring force provided by a single spring. In other embodiments, the profile may correspond to the spring force provided by a plurality of springs. As the compression of the spring increases during profile portion 32, the spring force increases until it reaches a peak force 34 at a particular compression. As the spring compression increases past the peak force compression point, the spring force decreases until the spring compression reaches a spring rate nadir point 36. In some embodiments, this nadir point may correspond to the maximum spring displacement, or the spring force may continue to increase after this nadir point.

In particular embodiments, it may be desirable for the piezoelectric actuator to operate entirely within the negative rate zone 33. Accordingly, the negative rate Belleville spring can be configured such that, when the piezoelectric element is at a minimum expansion, the Belleville spring remains compressed. Such a set point 35 of a Belleville spring may be chosen according to the application. Additionally, the spring rate profile may be configured such that the compressive point corresponding to the nadir is greater than or equal to the maximum extension of the piezoelectric element.

In alternative embodiments, it may be desirable for the piezoelectric actuator to operate in alternative spring rate zones. For example, in the illustrated profile, a set point of 0.03 inches would result in an opposing force on the piezoelectric actuator that decreases as the actuator extends to the nadir, and that increases as the actuator expands past the nadir. In some embodiments, the nadir point may be configured such that it remains at a positive potential energy state. Accordingly, in these embodiments, the spring is configured such that it will not invert into a negative potential state even if the spring is compressed beyond the normal operating range. For example, in FIG. 3, if the nadir force was −20 then the spring would invert and snap over into a forced negative potential state if it were compressed to the nadir distance.

FIG. 4 illustrates an example negative rate Belleville washer 40 according to an embodiment of the invention. The washer 40 has an inside diameter 46, and an outside diameter 45. In the illustrated example, the inside diameter is between 0.255 and 0.258 inches, while the outside diameter is 0.5 inches. The washer further has a thickness 42 and a spring height 43. In the illustrated example, the thickness is approximately 0.0100 inches and the height is approximately 0.0245 inches. In some embodiments, the area 47 may be an empty space such that the washer portion 40 comprises the entire Belleville washer. For example, a fuel injector nozzle needle may be threaded through area 47 such that it may be coupled directly to a piezoelectric actuator. In other embodiments, area 47 may comprise a portion of the Belleville washer. For example, area 47 may be composed of the same material as, and integrally formed with, the washer portion 40.

The combination of the Belleville outside diameter, inside diameter, thickness, material composition, and spring height defines the Belleville spring function. Any of these factors may be varied according to desired performance. Additionally, as described herein, multiple Belleville springs can be combined in parallel or series. Each spring of such a plurality may be configured to have a different spring profile. Accordingly, a wide variety of spring profiles may be selected depending on particular needs of an application.

Figure 5:
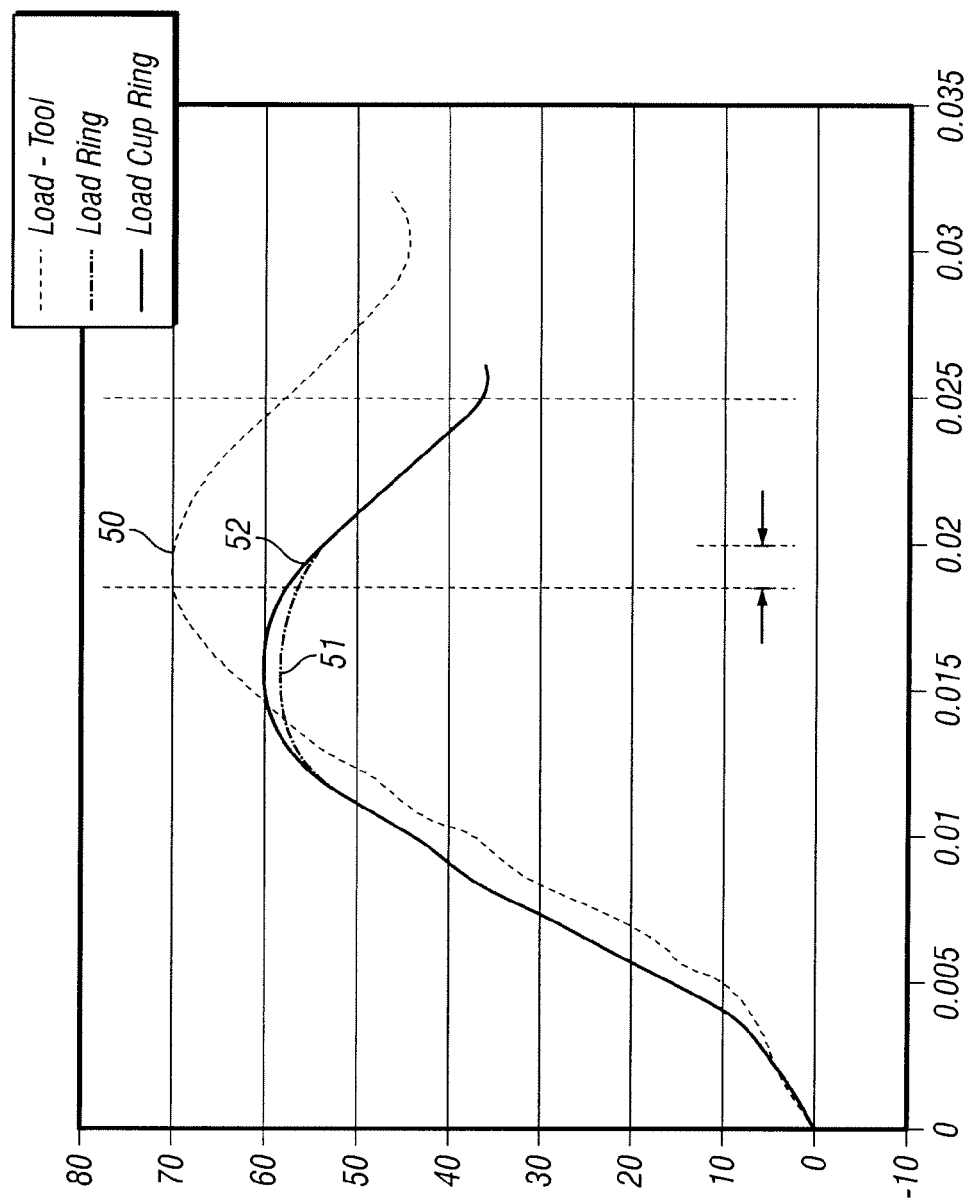
FIG. 5 is a graph illustrating the effects of radial fit of a washer according to an embodiment of the invention.

FIG. 5 is a graph illustrating the effects of radial fit available to the washer according to an embodiment of the invention. During the compression and relaxation cycle, a Belleville washer will typically change inside and outside diameter. The washer will typically have a maximum outer diameter at maximum compression and a minimum outer diameter at minimum compression. Correspondingly, the washer will typically have a minimum inner diameter at maximum compression and a maximum inner diameter at minimum compression. The installation of the washer in the particular application will typically take these diameter changes into account.

Curve 50 illustrates a spring force profile from a washer set in a tool housing such that the edges of the washer were constricted during spring compression. As the graph illustrates, this construction resulted in a horizontal shift to the right and a vertical upward shift of the negative rate zone, and a corresponding increase in the positive rate zone. Curves 51 and 52 illustrate two consecutive tests of the same washer as in curve 50. In curves 51 and 52, the tool housing was expanded such that the edges of the washer were not constricted during spring compression. As the graph illustrates, the negative rate portions of curves 51 and 52 are horizontally shifted left and vertically shifted down with respect to curve 50. Accordingly, testing under proper washer radial fit that corresponds to the fit available in the particular application may be utilized for evaluation purposes.

In other embodiments, it may be desirable to manipulate the spring force profile by constriction of the washer. For example, the washer may be housed in a metal cylinder that expands as it is heated. In this example, it may be desirable to reduce the actuator stroke length as temperature increases. Accordingly, the washer outer diameter might be configured such that it is constricted when the metal cylinder is cool and it has sufficient play to fully expand when the metal cylinder is hot.

FIG. 6 illustrates raw data results of a test in a piezoelectric fuel injector application according to an embodiment of the invention. Utilization of the selected negative rate Belleville washers (as indicated in the figure) in parallel is computed to result in a 14.4% improvement in stroke length as compared to standard Belleville washers that have a compressive force that increases with increased displacement. Utilization of various subsets of the selected negative rate Belleville washers would result in different improvements over standard Belleville washers.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of operating a piezoelectric actuator, comprising:
    providing a compressive force to a piezoelectric element, said compressive force provided by a plurality of springs wherein individual springs within said plurality of springs are provided in a stacked arrangement such that one or more of said springs are on another of said one or more springs;
    wherein the compressive force varies with displacement of the piezoelectric element such that the compressive force is less at a first displacement than at a second displacement; and
    wherein the first displacement is greater than the second displacement.

2. The method of claim 1, wherein the step of providing a compressive force comprises providing a compressive force during a retraction phase of the piezoelectric element.

3. The method of claim 2, wherein the compressive force monotonically increases between the first displacement and the second displacement.

4. The method of claim 3, wherein the first displacement substantially corresponds to a greater displacement of the piezoelectric element, and the second displacement substantially corresponds to a lesser displacement of the piezoelectric element.

5. The method of claim 4, wherein the compressive force is configured such that the piezoelectric element has a predetermined displacement stroke.

6. The method of claim 5, wherein the compressive force is further configured such that the piezoelectric element is placed under a biasing pressure during an expansion phase of the piezoelectric element.

7. The method of claim 1, further comprising metering fuel from a fuel injector using the piezoelectric element.

8. The method of claim 7, wherein the fuel injector is a heated catalyzed fuel injector and is configured to inject fuel in a supercritical state.

9. The method of claim 8, further comprising operating an internal combustion engine using the fuel injector.

10. An apparatus for enabling operation of a piezoelectric actuator, comprising:
    a plurality of springs configured to provide a compressive force to a piezoelectric element of a piezoelectric actuator, said plurality of springs provided in a stacked arrangement such that one or more springs in said plurality of springs are on another of said one or more springs;
    wherein the compressive force varies with displacement of the piezoelectric element such that the compressive force is less at a first displacement than at a second displacement; and
    wherein the first displacement is greater than the second displacement.

11. The apparatus of claim 10, wherein the said plurality of springs comprises negative rate Belleville washers.

12. The apparatus of claim 11, wherein the compressive force monotonically increases between the first displacement and the second displacement.

13. The apparatus of claim 12, wherein the compressive force is configured such that the piezoelectric element has a predetermined displacement stroke.

14. The apparatus of claim 13, wherein the piezoelectric actuator comprises a plurality of piezoelectric elements bonded together; and wherein the spring is configured to provide the compressive force to the plurality of piezoelectric elements.

15. The apparatus of claim 14, wherein the compressive force is further configured such that the plurality of piezoelectric elements remain bonded together during a contraction of the piezoelectric actuator.

16. The apparatus of claim 11, wherein said plurality of springs comprises a plurality of Belleville washers positioned in a stacked arrangement in series to one another.

17. The apparatus of claim 11, further comprising a piezoelectric actuator in communication with the spring, the piezoelectric actuator comprising a piezoelectric element.

18. The apparatus of claim 17, further comprising a fuel injector coupled to the piezoelectric actuator.

19. The apparatus of claim 18, wherein the compressive force is configured such that the piezoelectric actuator has a predetermined stroke whereby the fuel injector meters a predetermined amount of fuel.

20. The apparatus of claim 19, further comprising a fuel chamber disposed such that pressurized fuel in the fuel chamber applies a bias pressure to the piezoelectric actuator.

21. The apparatus of claim 19, wherein the fuel injector comprises a heated catalyzed fuel injector that dispenses fuel in a supercritical state.

22. A system, comprising:
   a piezoelectric actuator comprising a piezoelectric element;
   a plurality of springs configured to provide a compressive force to the piezoelectric element, said plurality of springs arranged such that at least one of the springs in said plurality of springs is on another of said springs;
   a fuel injector coupled to the piezoelectric actuator; and
   an internal combustion engine coupled to the fuel injector;
   wherein the compressive force varies with displacement of the element such that the compressive force is less at a first displacement then at a second displacement; and
   wherein the first displacement is greater than the second displacement.

23. The system of claim 22, wherein said piezoelectric element is cylindrical.

24. The system of claim 23, wherein individual springs in said plurality of springs are arranged such that they all share a common central axis with the cylinder.

* * * * *